United States Patent [19]

Ando et al.

[11] Patent Number: 4,972,798
[45] Date of Patent: Nov. 27, 1990

[54] DRAWING MACHINE

[75] Inventors: Tateo Ando, Osaka; Akira Kabeshita, Hirakata, both of Japan

[73] Assignee: Matsushita Electric Industrial Co., Ltd., Kadoma, Japan

[21] Appl. No.: 327,990

[22] Filed: Mar. 23, 1989

[30] Foreign Application Priority Data

Mar. 25, 1988 [JP] Japan .................................. 63-72460

[51] Int. Cl.⁵ .............................................. B05C 1/02
[52] U.S. Cl. ................................... 118/669; 118/680; 118/323
[58] Field of Search .................. 425/141, 375; 118/52, 118/54, 668, 680, 669, 671, 679, 668, 669, 680, 681, 712, 300, 323, 32, 54

[56] References Cited

U.S. PATENT DOCUMENTS

| | | | |
|---|---|---|---|
| 4,334,495 | 6/1982 | Derkacs et al. | 118/669 |
| 4,451,507 | 5/1984 | Beltz et al. | 118/52 |
| 4,643,864 | 2/1987 | Martini | 264/220 |
| 4,749,347 | 6/1988 | Valavaara | 425/375 |

FOREIGN PATENT DOCUMENTS 0211372  2/1987  European Pat. Off. ............ 118/680

Primary Examiner—Willard Hoag
Attorney, Agent, or Firm—Cushman, Darby & Cushman

[57] ABSTRACT

A first distance measurement device for measuring a height of the surface of a substrate with respect to a reference plane of a drawing machine which drawing a pattern on the substrate by issuing paste-like material from a nozzle is mounted on a revolution member rotating about the nozzle, and the first distance measurement device is always positioned in the moving direction of the nozzle and measures a height of the surface of the substrate at a slightly preceding position from the nozzle, on the other hand a second distance measurement device substantially measures a height of the nozzle from the reference plane, thus, a position of the nozzle is controlled on the basis of both the measured result, and an interval between the nozzle and the surface of the substrate is kept within a predetermined value.

4 Claims, 4 Drawing Sheets

DRAWING MACHINE

FIELD OF THE INVENTION AND RELATED ART STATEMENT

FIELD OF THE INVENTION

The present invention relates to a drawing machine for painting paste-like material such as paste including electrical conductive material along a predetermined pattern on a circuit substrate.

DESCRIPTION OF THE RELATED ART

A conventional drawing machine comprises a nozzle for issuing paste-like material on a circuit substrate and an X-Y table controlled by a numerical control system which is disposed under the nozzle so as to have the circuit substrate thereon. The X-Y table is moved along a predetermined pattern issuing the paste-like material on the circuit substrate. An interval between the nozzle and the surface of the circuit substrate must be maintained at a predetermined distance during the drawing process; otherwise the thickness of issued paste-like material layer cannot be maintained at a constant value and a precise circuit pattern cannot be fabricated.

In order to improve the above-mentioned problem, a position detector is arranged adjacent to the nozzle, and concavity or convexity of the surface of the circuit substrate positioned on the X-Y table is measured by a position detector all over the surface of the circuit substrate to be drawn in subsequent process. The measured data is memorized in a memory of the numerical control system, and the interval between the surface of the circuit substrate and the nozzle is controlled on the basis of the memorized data in the subsequent drawing process so as to maintain the constant value.

In the above-mentioned prior art, however, the process for detecting concavity or convexity of the circuit substrate is required in addition to the process for drawing and the number of process increases, and thus a processing time increases and a more complicated control system is required.

In order to resolve this difficulty in the prior art, a position detector is mounted on the nozzle, and the surface of the circuit substrate is detected by the position detector during the drawing process, and thus the position of the nozzle is controlled on the basis of the detected data of the position detector. In this method, however, since the position detector is mounted on the nozzle, the position of the position detector with respect to the surface of the circuit substrate is varied together with that of the nozzle. Consequently, a detected data of the position detector must be compensated corresponding to the position of the nozzle, and thus a complicated data processing system is required and a high speed drawing cannot be realized. Moreover, when the nozzle is exchanged with a new one, a relative position between the position detector and the new nozzle is changed, and adjustment therefor is troublesome and requires much time.

OBJECT AND SUMMARY OF THE INVENTION

An object of the present invention is to provide a drawing machine in which detection of a position of a surface to be drawn and a drawing process are accomplished in an integral process, and the detection of the surface is independent from the action of the nozzle.

The drawing machine in accordance with the present invention comprises:

a table to be moved on a predetermined plane by a numerical control system, a substrate positioned on the table, a nozzle for issuing paste-like material on the substrate, a revolution member having first distance measurement means for measuring a distance between the distance measurement means and the substrate in the proximity of the nozzle on the course thereof, second distance measurement means for measuring a distance between the nozzle and the second distance measurement means, and nozzle driving means for controlling a distance between the nozzle and the substrate on the basis of measured data of the first distance measurement means and second distance measurement means.

According to the present invention, the first distance measurement means mounted on the revolution member is turned about the nozzle and revolution of the revolution member is controlled by the numerical control system, and thereby the first distance measurement means is always positioned in the moving direction of the nozzle. A distance between the nozzle and the surface of the substrate is measured at a position preceding by a predetermined distance in the moving direction of the nozzle. Consequently, a distance between the nozzle and the surface of the substrate can be measured in the position preceding the nozzle even if the pattern curves, and the distance between the nozzle and the surface of the substrate can be maintained within a predetermined value.

While the novel features of the invention are set forth particularly in the appended claims, the invention, both as to organization and content, will be better understood and appreciated, along with other objects and features thereof, from the following detailed description taken in conjunction with the drawings.

It will be recognized that some or all of the Figures are schematic representations for purposes of illustration and do not necessarily depict the actual relative sizes or locations of the elements shown.

DESCRIPTION OF THE PREFERRED EMBODIMENT

Figure 1:
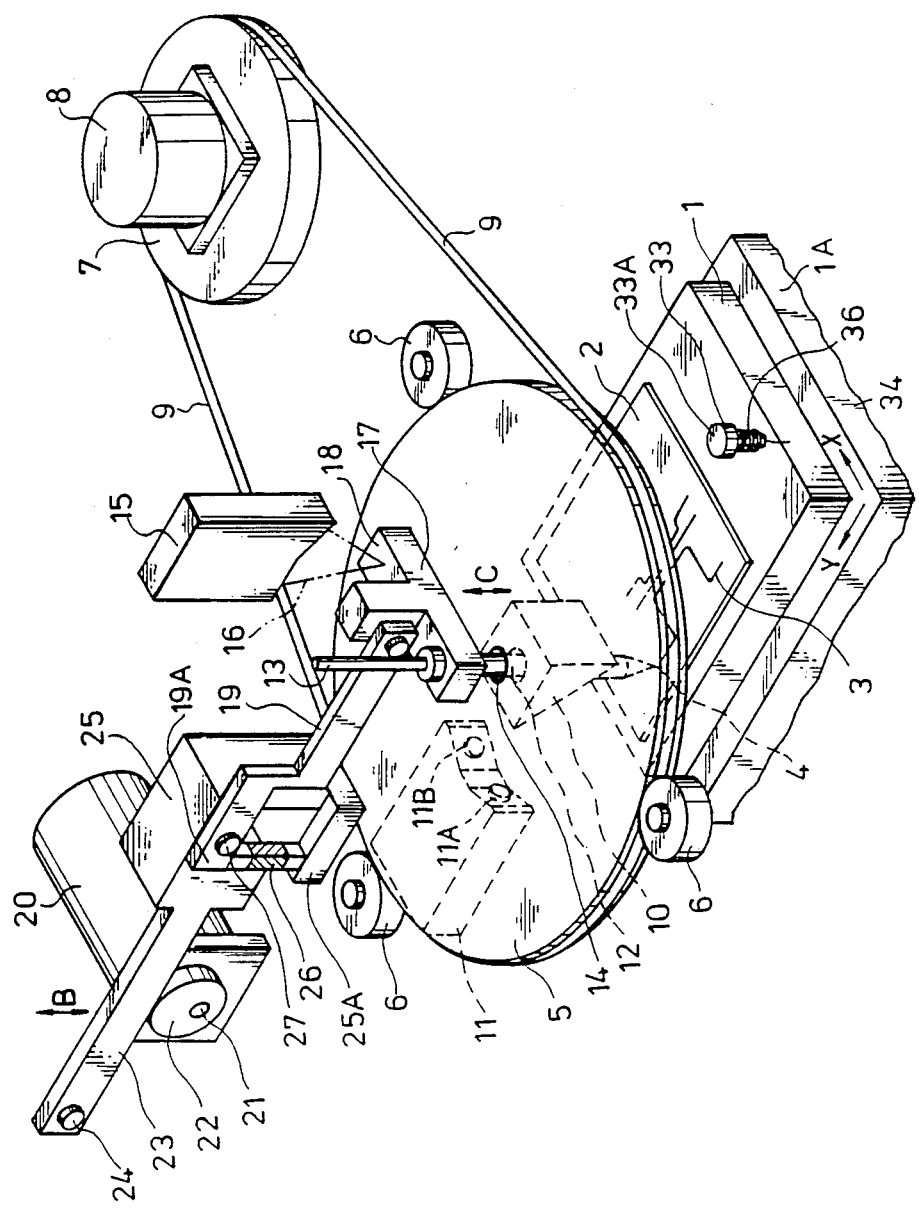
FIG. 1 is a perspective view of an embodiment of the drawing machine in accordance with the present invention.

FIG. 1 is a perspective view of an embodiment of the drawing machine in accordance with the present invention. Referring to FIG. 1, a substrate 2 such as a circuit board, whereon a predetermined circuit pattern is formed by paste-like material such as paste including electrical conductive material, is placed on a table 1 which is moved in the directions of arrows X and Y on a base 1A by a numerical control system as is generally understood. Thus, an illustration showing a construction therefore will be omitted. A nozzle holder 12 having a nozzle 4 on the lower end is substantially vertically held with respect to the substrate 2 by a holding member 17. The paste including electrical conductive material is supplied to a tube 13 from a supply machine of paste-like material (not shown) and issued from the nozzle 4 on the substrate The holding member 17 is mounted on an arm 19 and the arm 10 is pivotally mounted on a nozzle driving mechanism 25 by a shaft 27. A piezo-device 20 is mounted between an end 19A of the arm 10 and a beam 25A of the driving mechanism 25, and the arm 19 is rotated about the shaft 27 by expansion or contraction of the piezo-device 26. The nozzle driving mechanism 22 is suspended by a lever 23 which is pivotally mounted on a shaft 24. The lever 23 contacts an eccentric cam 22 coupled on a shaft 21 of a motor 20 and is rotated by revolution of the motor 20 in the direction of arrow B. In the embodiment, the motor 20 is a stepping motor, and the nozzle holder 12 is moved by 5 μm per one pulse in the direction of arrow C. Moreover, a minimum moving distance of the nozzle holder 12 μm by expansion or contraction of the piezo-device 20 is 1 μm, and the movement by the piezo-device 26 is added to the movement by the motor 20. Thus, the nozzle holder 12 is movable with an accuracy of 1 μm.

Figure 2:
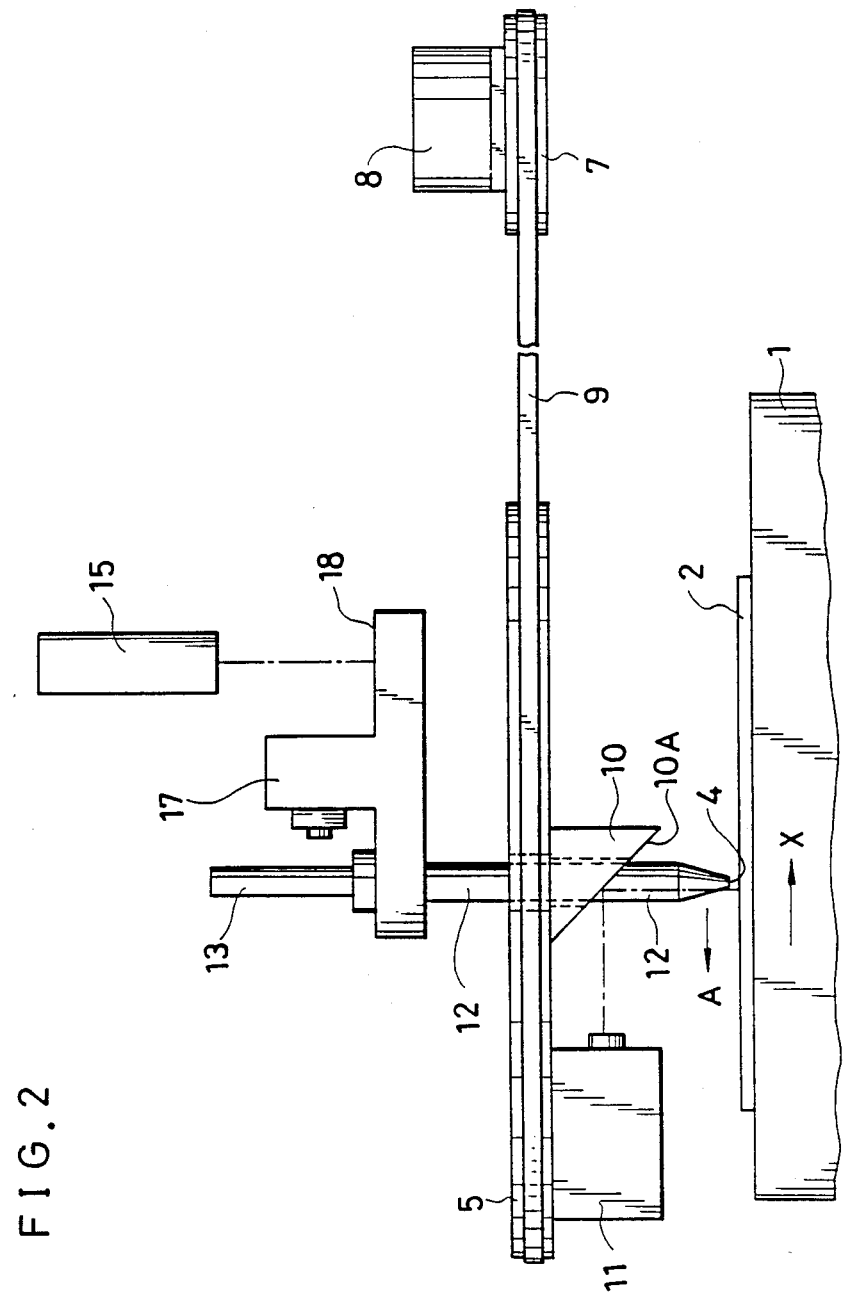
FIG. 2 is a front view of a main portion of the embodiment.

A disc 5 which is arranged over the X-Y table 1 is supported with three rollers 0 at their circumferential part for rotation about the center of the disc 5 by a motor 8 through a belt 9. A threaded aperture 14 is disposed at the center of the disc 5, and the nozzle holder 12 is inserted in the aperture 14. A distance measurement device 11 and a mirror 10A facing the distance measurement device 11 at 45°, as shown in FIG. 2, are mounted on the under surface of the disc 5.

The distance measurement device 11 is an apparatus for detecting a distance utilizing interference of laser beam, for example. Referring to FIG. 1 and FIG. 2, a laser beam which is radiated from a radiation aperture 11A is reflected by the mirror 10A and is directed to the substrate A laser light reflected from the substrate 2 is again reflected by the mirror 10A and is detected through an incidence aperture 11B. A distance between the distance measurement device 11 and the mirror 10A is constant, but a distance between the mirror 10A and the surface of the substrate 2 is varied by any concavity or convexity of the surface of the substrate 2. Consequently, a travelling distance of the laser beam from the radiation aperture 11A to the incidence aperture 11B is varied. Thereby, a distance between the disc S and the surface of the substrate 2 is measured. In the embodiment, the distance between the disc B and the surface of the substrate 2 is substantially converted into a distance between the surface of the substrate 2 and the surface of the table 1, since the disc 5 is supported by the three rollers 6 which are mounted on a common base 1A of the table 1.

A pattern which is drawn by the paste-like material on the surface of the substrate Z is previously programmed on the numerical control apparatus, and the table 1 is moved in the direction of the arrows X and Y in compliance with the program. A light beam which is emitted from the radiation aperture 11A of the distance measurement device 11, as shown in FIG. 2, applied on the surface of the substrate 2 at a position which is slightly advanced from the nozzle 4 in the relative moving direction of the nozzle 4 (the table 1 moves to the direction of arrow X. and the nozzle 4 relatively moves to the direction of arrow A). Therefore, the distance measurement device 11 detects a concavity or convexity which is present in the moving direction of the nozzle 4. In order to realize the above-mentioned operation, revolution of the disc 5 is controlled by the numerical control apparatus. Namely, a position of the disc 5 having the distance measurement device 11 is previously programmed in the numerical control apparatus so that the distance measurement device 11 is always present in the moving direction of the nozzle 4.

Furthermore, issue of the paste-like material from the nozzle 4 is also controlled by the numerical control apparatus.

Another distance measurement device 1B is arranged over the holding member 17, and thereby a distance between the distance measurement device 17 and the reference surface 18 of the holding member 17 is measured.

Referring to FIG. 1, the shaft 24, the motors 8 and 20, the distance measurement device 15, rollers 6 and the base 1A of the X-Y table are mounted on a body of the drawing machine not shown in FIG. 1. Therefore, the distance measurement device 15 substantially measures a distance between the surface of the table 1 and the reference plane 18 of the holding member 17.

An adjustment stage 33 is provided on the surface of the table 1. The adjustment stage 33 is a jig for setting a distance between the nozzle 4 and the surface of the table 1 to a predetermined value when the nozzle holder 12 or the nozzle 4 is exchanged for another one. As shown in FIG. 4(a), the adjustment stage 33 has a reference surface 33A which is pushed by the nozzle 4 in an adjustment process. A stem 34 connected with the adjustment stage 33 is accommodated by a bearing 35 to allow movement in the direction of arrow D. A compression spring 36 is inserted between the table 1 and the adjustment stage, and the adjustment stage 33 is lifted up by the spring 36. Thus, a distance Q between the reference plane 33A and the table 1 is maintained to a predetermined value.

Figure 3:
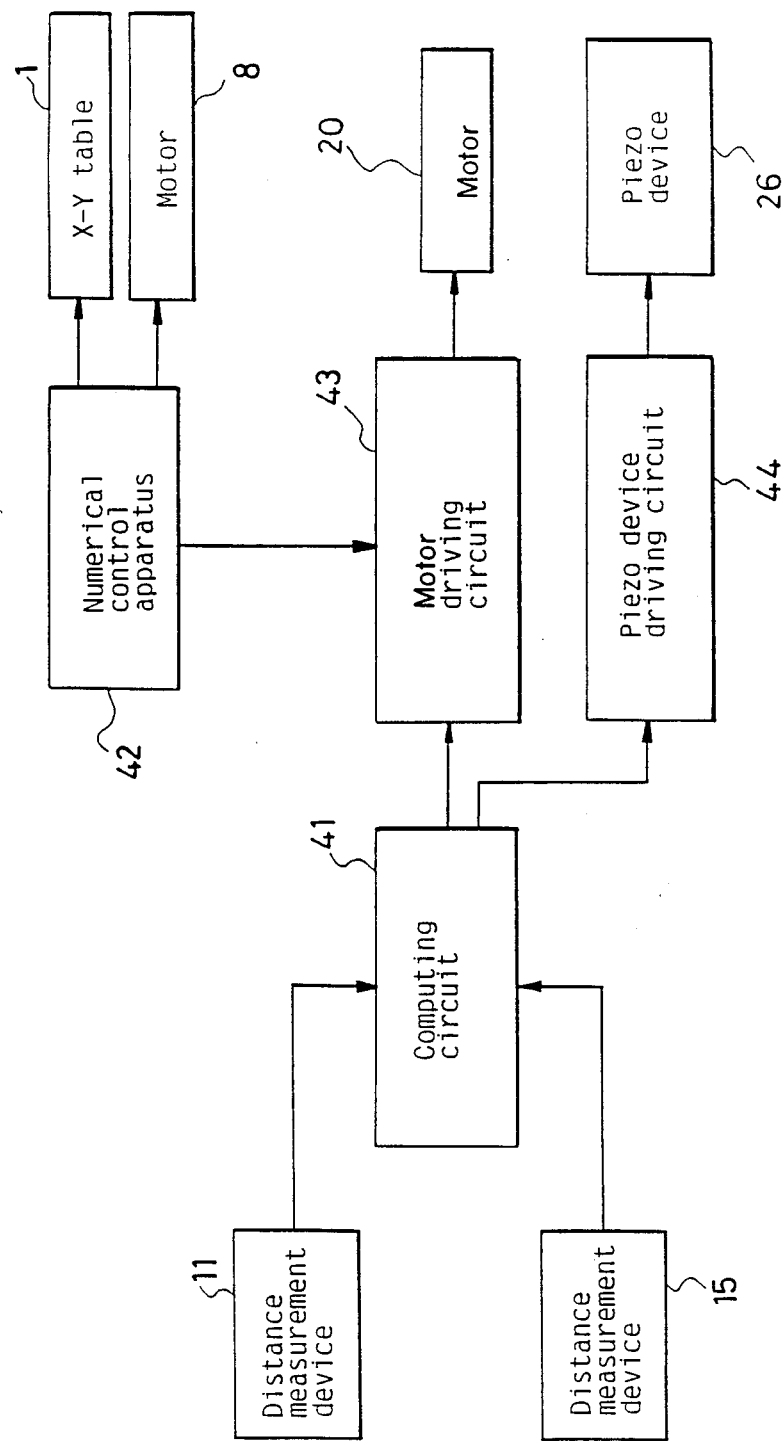
FIG. 3 is a block diagram of a control circuit of the embodiment.

Operation of the embodiment is elucidated hereafter. The nozzle 4 is positioned on a starting point of the pattern 3 by moving the X-Y table 1 after start of operation of the numerical control apparatus. Then, the nozzle 4 is lowered and approaches the surface of the substrate 2 with a predetermined interval. On the other hand, the disc 5 is rotated by the operation of the numerical control apparatus so that the distance measurement device 11 is positioned in the moving direction of the nozzle 2. In the above-mentioned status. the distance measurement device 11 measures a distance between the distance measurement device 11 and the surface of the substrate 2. A position of the reference plane 18 of the holding member 17 is simultaneously measured by the distance measurement device 15. The signals of the distance measurement devices 11 and 15 are inputted into the computing circuit 41 of the control circuit as shown in FIG. 3. Both the signals are compared each other in the computing circuit 41 and a moving distance of the nozzle 4 for closing it to the surface of the substrate 2 with the predetermined interval is computed, and then, driving signals for driving the motor 20 and the piezo-device 26 which render the distance between the nozzle 4 and the surface of the substrate 2 to the predetermined value (for example, 40 μm) are output. The output signals are applied to a motor driving circuit 43 and a piezo-device driving circuit 44, respectively. Thus, the motor 20 and the piezo-driving device 22 are driven by the outputs of the motor driving circuit 43 and piezo device driving circuit 44, respectively.

An interval between the nozzle 4 and the surface of the substrate 2 is determined on the basis of a moving velocity of the table 1, a viscosity of the paste-like material and a cross-section of the drawn paste like material.

In this way, the interval between the nozzle 4 and the surface of the substrate 2 reaches a predetermined value, and thereafter the paste-like material is issued on the substrate from the nozzle 4 while the table 1 is moved on a predetermined pattern by operation of the numerical control apparatus, and a pattern of the paste-like material is drawn on the substrate 2. The disc 5 is rotated by the motor 8 s that the distance measurement device 11 is always present in the moving direction of the nozzle 4.

According to the present invention, a variation of the height of the surface of the substrate 2 is detected at a position which slightly precedes the nozzle 4, for example 0.6–2 mm in the moving direction thereof. Therefore, the height of the surface of the substrate 2 is precisely measured. Moreover, since the measurement of the height of the surface is accomplished in concurrence with the drawing process, throughput of the drawing machine is improved.

In case that a width of the pattern is changed, the nozzle 4 must be replaced by a new one corresponding to the width of the pattern. Since a distance between the nozzle 4 and the table 1 is varied by the replacement, the position of the nozzle must be readjusted by changing the data memorized in the numerical control system.

Figure 4B:
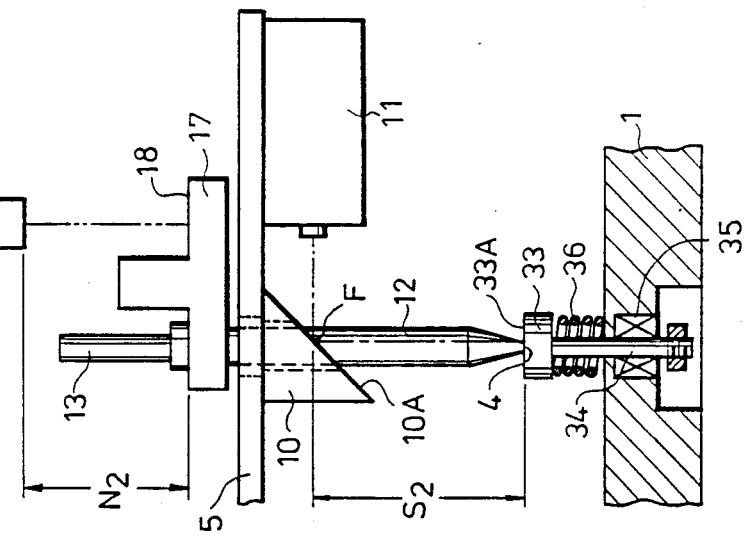
FIG. 4(a) and FIG. 4 (b) are front views showing adjustment process in accordance with the present invention.
Figure 4A:
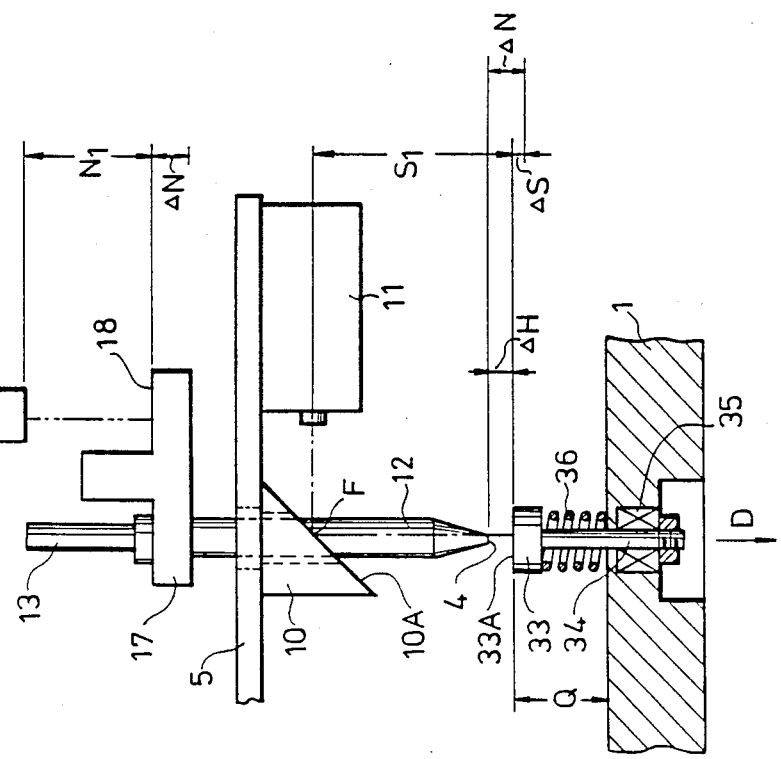

FIG. 4(a) and FIG. 4(b) show the adjustment process of the position of the nozzle 4. Referring to FIG. 4(a), after replacement of the nozzle 4, the new nozzle 4 is positioned over the adjustment stage 33, and a distance $S_1$ between the reference plane 33A of the adjustment stage 33 and the reflecting point F of the mirror 10A is measured. On the other hand, a distance $N_1$ between the reference plane 18 of the holding member 17 and the distance measurement device 15 is measured.

Subsequently, as shown in FIG. 4(b), the nozzle holder 12 having the new nozzle 4 is lowered by driving the motor 20, and the nozzle 4 is positioned so as to slightly push the adjustment stage 33. Then, a distance $S_2$ between the reflecting point F and the reference plane 33A is measured by the distance measurement device 11 and a distance $N_2$ between the distance measurement device 15 and the reference plane 18 is measured by the distance measurement device 15. From these measured values, a shifted distance $\Delta N$ of the nozzle 4 is calculated by $$\Delta N = N_2 - N_1 \quad (1).$$

Moreover, a shifted distance $\Delta S$ of the adjustment stage 33 is calculated by $$\Delta S = S_2 - S_1 \quad (2).$$

Consequently, as shown in FIG. 4(a), a distance $\Delta H$ between the nozzle 4 and the reference plane 33A is calculated by $$\Delta H = \Delta N - \{S \quad (3).$$

The distance $\Delta H$ is registered in the memory of the numerical control apparatus by manual operation. Thus, after then the nozzle 4 is controlled on the basis of the distance $\Delta H$ in the numerical control apparatus.

As mentioned above, according to the present invention when the nozzle 4 is replaced by other one, the adjustment of the height of the nozzle 4 is readily completed. Consequently, operation of the drawing apparatus is simplified.

Although the invention has been described in its preferred form with a certain degree of particularity, it is understood that the present disclosure of the preferred form has been changed in the details of construction and the combination and arrangement of parts may be resorted to without departing from the spirit and the scope of the invention as hereinafter claimed.

What is claimed is:

1. A drawing machine comprising:
    a table configured to be moved on a predetermined plane by a numerical control system,
    a substrate positioned on said table,
    a nozzle for issuing past-like material onto said substrate,
    a revolution member rotatable about an axis of said nozzle, having first distance measurement means for producing a light beam and light reflection means disposed on said revolution member adjacent to said nozzle for reflecting the light produced by said first distance measurement means to a spot to be measured in the proximity of said nozzle, which is spaced from said nozzle in a direction dependent on a position of turning of said revolution member for measuring a distance between said first distance measurement means and said substrate at said spot,
    second distance measurement means for measuring a distance indicative of a separation between said nozzle and said second distance measurement means, and p1 nozzle driving means for controlling a distance between said nozzle and said substrate on the basis of measured data of said first distance measurement means and of said second distance measurement means.

2. A drawing machine comprising:
    a table which is movable in a predetermined plane,
    a substrate positioned on said table,
    a nozzle for issuing paste-like material onto said substrate,
    a revolution member rotatable about an axis of said nozzle, having first distance measurement means for emitting light and light reflection means disposed on said revolution member adjacent to said nozzle for reflecting the light produced by said first distance measurement means to a spot to be measured in the proximity of said nozzle, which is spaced from said nozzle in a direction dependent on a position of turning of said revolution member, for measuring a distance between said first distance measurement means and said substrate at said spot,
    a second distance measurement means for measuring a distance indicative of a separation between said nozzle and said second distance measurement means,
    a nozzle driving means for controlling a distance between said nozzle and said substrate on the basis of measured data of said first distance measurement means and said second distance measurement means, and
    means, movable in the direction of moving of said nozzle, for detecting a position of said nozzle with respect to said table.

3. A drawing machine as in claim 1, further comprising means for controlling a position of said revolution member such that said first distance measuring means measures a distance at a spot where said nozzle will issue said paste-like material at a future moment.

4. A drawing machine as in claim 2, further comprising means for controlling a position of said revolution member such that said first distance measuring means measures a distance at a spot where said nozzle will issue said paste-like material at a future moment.

* * * * *